(12) United States Patent
Reboh

(10) Patent No.: US 11,967,633 B2
(45) Date of Patent: Apr. 23, 2024

(54) METHOD FOR FABRICATING A DOPED REGION OF A MICROELECTRONIC DEVICE

(71) Applicant: COMMISSARIAT A L'ENERGIE ATOMIQUE ET AUX ENERGIES ALTERNATIVES, Paris (FR)

(72) Inventor: Shay Reboh, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 344 days.

(21) Appl. No.: 17/455,425

(22) Filed: Nov. 18, 2021

(65) Prior Publication Data

US 2022/0157970 A1 May 19, 2022

(30) Foreign Application Priority Data

Nov. 18, 2020 (FR) ...................... 20 11824

(51) Int. Cl.
*H01L 29/66* (2006.01)
*H01L 21/02* (2006.01)
(Continued)

(52) U.S. Cl.
CPC .... *H01L 29/66636* (2013.01); *H01L 29/0847* (2013.01); *H01L 29/6653* (2013.01); *H01L 29/6656* (2013.01)

(58) Field of Classification Search
CPC ......... H01L 21/02667; H01L 21/28141; H01L 21/76248; H01L 29/0653; H01L 29/0847;
(Continued)

(56) References Cited

U.S. PATENT DOCUMENTS 6,232,641 B1 5/2001 Miyano et al.
2001/0023108 A1 9/2001 Miyano et al.
(Continued)

FOREIGN PATENT DOCUMENTS

EP 2 765 599 A1 8/2014
WO WO 2004/008489 A2 1/2004

OTHER PUBLICATIONS

French Preliminary Search Report dated Aug. 11, 2021 in 20 11824 filed on Nov. 18, 2020, 9 pages (with English Translation of Categories of Cited Documents & Written Opinion).

*Primary Examiner* — David C Spalla
(74) *Attorney, Agent, or Firm* — Oblon, McClelland, Maier & Neustadt, L.L.P.

(57) ABSTRACT

A method for forming at least one doped region of a transistor includes providing a stack having an insulating layer, an active layer, and a gate pattern having a first lateral flank and removing a first portion of the active layer not overlaid by the gate pattern and extending down to the gate pattern, at the edge of a second portion of the active layer overlaid by the gate pattern, so as to expose an edge of the second portion. The edge extends substantially in a continuation of the lateral flank of the gate pattern. The method also includes forming a first spacer having an L shape and having a basal portion in contact with the insulating layer and a lateral portion in contact with the lateral flank; forming a second spacer on the first spacer; removing the basal portion of the first spacer by selective etching with respect to the second spacer, so as to expose the edge of the second portion; and forming the doped region by epitaxy from the exposed edge.

13 Claims, 2 Drawing Sheets

(51) Int. Cl.
*H01L 21/225* (2006.01)
*H01L 29/08* (2006.01)

(58) Field of Classification Search
CPC ........... H01L 29/6653; H01L 29/66553; H01L 29/6656; H01L 29/66636; H01L 29/7848; H01L 29/78618
See application file for complete search history.

(56) References Cited

U.S. PATENT DOCUMENTS

| | | |
|---|---|---|
| 2004/0007724 A1 | 1/2004 | Murthy et al. |
| 2004/0132258 A1* | 7/2004 | Jin ...................... H01L 29/6656 257/E29.267 |
| 2005/0272187 A1 | 12/2005 | Murthy et al. |
| 2005/0282344 A1 | 12/2005 | Jin et al. |
| 2014/0370668 A1* | 12/2014 | Niebojewski ..... H01L 21/02667 438/166 |
| 2015/0044841 A1* | 2/2015 | Batude .............. H01L 21/02592 438/300 |
| 2016/0042955 A1 | 2/2016 | Niebojewski et al. |
| 2016/0300927 A1* | 10/2016 | Reboh ............... H01L 29/41783 |

\* cited by examiner

METHOD FOR FABRICATING A DOPED REGION OF A MICROELECTRONIC DEVICE

TECHNICAL FIELD

The present invention relates to the field of microelectronics. It finds a particularly advantageous embodiment in the production of sources and drains in transistors requiring low thermal budgets, especially in the field of monolithic 3D integration.

PRIOR ART

Historically, developments in the semiconductor industry have aimed to follow, through a shared roadmap, Moore's Law, which expects the density of electronic chips to double every eighteen months or so. The technology nodes on this roadmap are generally defined by the fine engraving of the transistors in the integrated circuits.

For technology nodes with an etch fineness of less than 10 nm, the required developments are extremely complex and costly. An alternative solution for the most advanced technology nodes, which eases some of the constraints related to the etch fineness, is to integrate the transistors by means of a three-dimensional (3D) architecture. This 3D integration concept is a promising solution to generally improve the relative power/performance/space/cost requirements of integrated circuits, following a so-called "Moore than Moore" approach while allowing for co-integration of different devices at different levels.

Among the very large scale 3D integration (or 3D VLSI) methods, the CoolCube™ proposes forming transistors on top of each other in a sequential manner. One challenge in this method is how to manage the thermal budget during formation of the upper layers of the transistors. In order to preserve the optimal electric characteristics of the on the lower layers of the stack, the temperature rise during the various steps of the method should be kept to the barest minimum. In particular, the formation of doped regions on either side of the channel of the transistor, typically the source and drain regions of the transistor, usually requires a step of activating and/or diffusing dopants, after ion implantation of dopant species.

A conventional solution for activating dopants in planar technology is to perform a high temperature thermal annealing, typically at a temperature T>1000° C., after implanting dopants.

An existing solution for activating dopants in 3D integration technology is to amorphise a portion of the semiconductor layer designed to form the source and drain regions, before or during implantation of dopants. After implanting dopants, these dopants are activated during solid phase recrystallisation of the amorphous semiconductor layer. The recrystallisation/activation step may be performed at a lower temperature, typically at a temperature T<600° C.

FIGS. 1A to 1C illustrate the steps of such a recrystallisation method codenamed SPER, an acronym for Solid-Phase Epitaxial Regrowth. FIG. 1A illustrates a device (1) for forming a transistor and comprising a gate pattern (10) flanked by a spacer (11) on a substrate (20) of the SOI (Silicon on Insulator) type. FIG. 1B illustrates an ion bombardment at the edge of the spacer (11), adapted to partially amorphise the upper silicon layer (22) (topSi) of the SOI substrate, and to implant dopants into this amorphous portion (22a). A crystalline portion (22b) of the topSi layer is maintained at the end of this bombardment, so as to form a seed for the future recrystallization. FIG. 1C illustrates the partial recrystallization of topSi from this seed (22b). During recrystallization, the dopants are incorporated and activated. This recrystallization ultimately produces a doped region (13).

One of the drawbacks of this solution based on the SPER recrystallization method is that there is a undoped region (22d) between the channel (15) and the doped region (13), under the spacer (11). This increases the access resistance of the transistor. Another drawback is the presence of the undoped seed (22b) underlying the doped region (13). This further increases the access resistance of the transistor. Additionally, for small topSi thicknesses, e.g., less than 10 nm, proper control of the amorphisation depth becomes critical. As a result, implementing the SPER method becomes complex. Furthermore, recrystallisation of the amorphous portion (22a) of topSi is generally not complete. Since a non-crystallized surface residual layer (22c) remains, it is thus necessary to provide etching in order to remove it.

Document US 2004/0132258 A1 discloses a solution for decreasing the access resistance of the transistor, in the case of a substrate with a recess. This solution is not suitable for 3D integration methods.

An object of the present invention is to at least partially overcome some of the above-mentioned drawbacks.

A more particular object of the present invention is to provide a method for forming a doped area that will improve the access resistance of a microelectronic device.

The other objects, features and advantages of the present invention will become apparent upon examination of the following description and accompanying drawings. It is understood that other advantages can be incorporated.

SUMMARY

In order to achieve this objective, a first aspect of the invention relates to a method for forming at least one doped region intended to form a source or a drain of a transistor, comprising the following steps:

Providing a stack comprising in a direction z at least one insulating layer, one active layer made of a semiconductor material overlying the insulating layer, and one transistor gate pattern overlying the active layer and having at least one lateral flank extending on a plane substantially perpendicular to an upper face of the active layer;

Removing a first portion of the active layer not overlaid by the gate pattern, said first portion extending down to the gate pattern directly at the edge of a second portion of the active layer, said second portion being located under the gate pattern, so as to expose an edge of said second portion, said edge extending substantially in a continuation of the lateral flank of the gate pattern;

Forming a first spacer made of a first material on the lateral flank and on said edge, said first spacer having an L shape and comprising a basal portion in contact with the insulating layer, and a lateral portion in contact with the lateral flank, said basal portion having a thickness along the direction z substantially equal to the thickness of the active layer;

Forming a second spacer made of a second material on the first spacer, said second spacer having a shape complementary to that of the first spacer;

Removing the basal portion of the first spacer by selectively etching the first material with respect to the second material of the second spacer and the semiconductor material, so as to expose the edge of the second portion by at least partially retaining the lateral portion of the first spacer on the lateral flank of the gate pattern;

Forming the doped region by epitaxy from said exposed edge.

Advantageously, the first portion of the active layer is removed before forming the first spacer. This allows the first portion to be removed as close as possible to the gate pattern. After the first portion has been removed, the edge of the second portion extends substantially as a continuation of the lateral flank. The doped region is formed starting from this edge. This edge thus becomes a junction between the second portion, typically the channel of the transistor, and the doped region, typically the source or drain of the transistor. Preferably this junction is abrupt.

Advantageously, such a method eliminates the residual undoped region that is plumb with the spacer(s), between the channel and the doped region, when implementing the known methods. The junction thus obtained helps to decrease the access resistance of the transistor. As previously mentioned with reference to FIG. 1B illustrating the prior art, bombardment performed in the context of known solutions does not allow to remove the undoped region, even if this bombardment was modified so as to tilt the bombardment direction.

Forming the doped region by lateral epitaxy, i.e. starting from the edge of the second portion, also rules out the need to keep an epitaxy seed underlying a modified portion, as implemented using known methods. Thus, the first portion can be removed over the entire thickness of the active layer, up to the insulating layer, so that the doped region has a thickness at least equal to that of the active layer, under the first and second spacers. Therefore, there is no need for an accurate control of an implantation depth, contrary to the known methods. This helps to simply the method. A doped region extending across the full height of the active layer also helps to decrease the access resistance of the transistor.

Advantageously, such a method can be implemented at low temperature, typically for temperatures T<600° C. Thus, this method is compatible with 3D integration technology.

BRIEF DESCRIPTION OF THE FIGURES

The goals, objects, features and advantages of the invention will become more apparent from the detailed description of an embodiment of the invention illustrated by the following accompanying drawings in which.

Figure 1A:
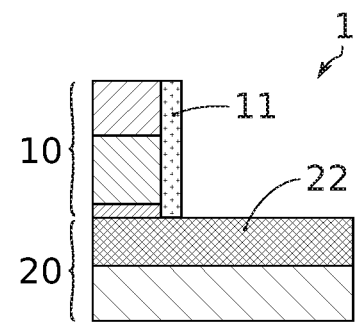
FIGS. 1A to 1C illustrate in cross-section the steps of forming a doped region according to a method of the prior art.
Figure 1B:
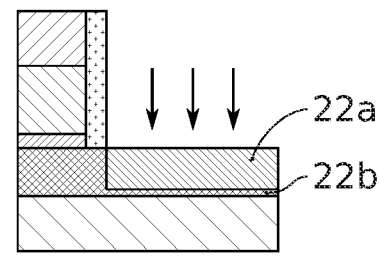
Figure 1C:
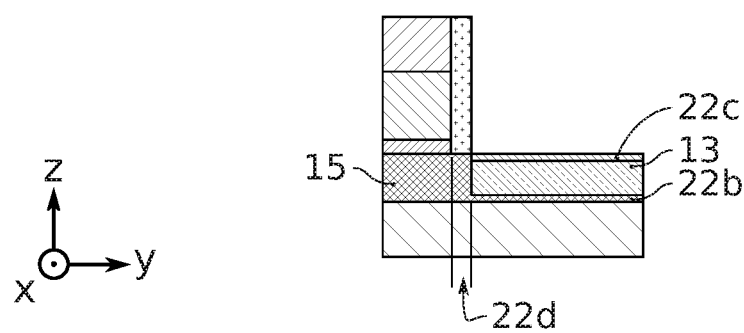

The drawings are given by way of examples and not intended to limit the invention. They constitute schematic representations of principle designed to facilitate understanding of the invention and are not necessarily on the scale of practical applications. In particular, the relative dimensions of the different layers, portions and elements of the device (e.g., spacers, active layer) do not represent reality. On the drawings, only one side of the gate and a single spacer are shown. It is understood that the method is applied symmetrically to the second side of the gate and to the second spacer. Thus, the figures can be extended symmetrically on either side of the z-axis.

DETAILED DESCRIPTION

Before proceeding to a detailed review of embodiments of the invention, the following are optional features that may be used in combination or alternatively:

In one example, the basal portion of the first spacer has a thickness in the direction z substantially equal to the thickness of the active layer A basal portion of a first spacer having a thickness less than the thickness of the active layer does not optimally decrease the access resistance of the transistor. A basal portion of a first spacer having a thickness more than the thickness of the active layer does not allow the gate of the transistor to be properly insulated. A basal portion of a first spacer having a thickness substantially equal to the thickness of the active layer helps to optimally decrease the access resistance of the transistor. A basal portion thickness "substantially equal" to the thickness of the active layer implies that the basal portion thickness is equal to the thickness of the active layer by ±10%, or preferably ±5%.

In one example, the selectivity of selective etching of the first material with respect to the semiconductor material is greater than or equal to 10:1, and preferably greater than or equal to 20:1.

In one example, the selectivity of selective etching of the first material with respect to the second material is greater than or equal to 5:1, and preferably greater than or equal to 10:1.

In one example, forming the first spacer comprises depositing a first non-conformal layer, such that the first layer has a thickness $e_y$ on the lateral flank and a thickness $e_z$ on the insulating layer, so that the thickness $e_y$ is less than the thickness $e_z$. A first spacer formed from a first non-conformal layer provides a thicker spacer basal portion than the spacer lateral portion, preferably such that the spacer basal portion has a thickness substantially equal to the thickness of the active layer. In addition, a less thick spacer lateral portion allows for more accurate and easier control of the "critical dimension", known by the acronym CD (this dimension on which dimensional control of the transistors is based).

In one example, the first material and the second material are dielectric materials.

In one example, the first material is made of silicon oxide or SiBCN.

In one example, the second material is different from the first material and is made of silicon nitride SiN or SiCO or of another material comprising at least two substances among Si, C, O, B, N.

In one example, the semiconductor material of the active layer is chosen between silicon and silicon germanium.

In one example, the doped region is made of silicon or silicon germanium.

In one example, the epitaxy of the doped region is configured such that said doped region extends beyond an upper face of the active layer in a direction substantially perpendicular to the active layer.

In one example, the first portion is removed by anisotropic dry etching along the direction z.

In one example, the epitaxy of the doped region is a lateral epitaxy primarily directed in a direction normal to the edge of the second portion.

In one example, the transistor gate pattern serves as an etching mask when removing the first portion.

In one example, the epitaxy of the doped region is implemented with in situ doping, such that the doped region directly has doping at the end of said epitaxy.

It is specified that, within the scope of the present invention, the terms "on", "overlying", "cover" or "underlying" or the equivalents thereof do not necessarily mean "in contact with". For example, the deposition of a first layer on a second layer does not necessarily mean that the two layers are directly in contact with each other, but rather means that the first layer at least partially covers the second layer by being either directly in contact or separated from it by at least one other layer or at least one other element.

Additionally, a layer may be composed of multiple sub-layers of the same material or different materials.

The term "substrate" means a layer, a device," made from" a material M, a substrate, a layer, a device comprising same material M only or same material M and optionally other materials, such as alloying elements, impurities or doping elements. Thus, a spacer made of silicon nitride SiN may for example include non-stoichiometric silicon nitride (SiN), or stoichiometric silicon nitride (Si3N4), or an oxy-silicon nitride (SiON).

Generally, but not limitatively, a spacer forms a ring around the gate, with a closed contour; the description of a spacer is preferably understood from this single spacer around the gate; however, the cross-sectional drawings, generally along a plane transverse to the longitudinal direction of the gates, show two spacer portions on either side of the flanks of the gate. By extension, these two spacer portions are often referred to as "the spacers". The latter terminology may optionally be adopted in this application, in other words "the first spacers" and/or "the second spacers". The invention also extends to embodiments in which "the first spacers" and/or "the second spacers" are discontinuous.

In particular, the present invention can be used for the fabrication of at least one transistor or multiple transistors on a substrate. The substrate may be of the semiconductor-on-insulator type, such as a silicon on insulator (SOI) substrate or a germanium on insulator GeOI substrate.

The invention can also be used more broadly for various microelectronic devices or components.

The term microelectronic device or device element means any type of element made by microelectronic means. In particular, these devices include, in addition to devices for purely electronic purposes, micromechanical or electromechanical devices (MEMS, NEMS . . . ), as well as optical or optoelectronic devices (MOEMS).

Several embodiments of the invention implementing successive steps of the fabrication method are described below. Unless explicitly stated, the adjective "successive", even if it is generally preferred, does not necessarily imply that the steps immediately follow each other, since they can be separated by intermediate steps. Furthermore, the term "step" implies the performance of a part of the method, and can designate a set of sub-steps.

The word "dielectric" refers to a material whose electrical conductivity is sufficiently low in the given application to serve as an insulator. In the present invention, a dielectric material preferably has a dielectric constant of less than 7. The spacers are typically formed out of a dielectric material.

The terms "gate pattern", gate stack" and "gate" are used synonymously.

The term "selective etching with respect to" or "etching with selectivity to" means an etching configured to remove a material A or a layer A with respect a material B or a layer B, and having an etching rate of the material A higher than the etching rate of the material B. Selectivity is the ratio of the etching rate of the material A to the etching rate of the material B.

In the present patent application, the term thickness will preferably be used for a layer, height for a device (e.g., transistor or gate) and depth for a cavity or an etching. Thickness is taken in a direction normal to the main extension plane of the layer, while height and depth are taken in a direction normal to the base plane of the substrate. The main extension plane of the layer, respectively the base plane of the substrate, is generally parallel to a lower face or an upper face of this layer, respectively of this substrate.

In the present patent application, an orthonormal preference mark formed by the x, y, z axes is shown on the accompanying drawings. The substrate, more specifically its lower face and/or its upper face, extend within the basal plane xy.

In the following, the length is taken in the direction carried by the x-axis, while the width is taken in the direction carried by the y-axis.

An element located "in line with" or "perpendicular to" another element means that these two elements are both located on the same line perpendicular to the basal plane, or on the same line directed along the z-axis on the figures. An element located "as a continuation" of another element means that these two elements are both oriented in the same direction or the same plane, and preferably as a continuation of each other.

The term "horizontal" or "basal" means an orientation parallel to an xy plane. The term "vertical" means an orientation parallel to a z plane.

The terms "substantially", "approximately", "in the order of" mean "close to 10%" or, where it is an angular orientation, "close to 10%". Thus, a direction substantially normal to a plane means a direction having an angle of 90±10° with respect to the plane.

The invention will now be described in detail through some non-limiting embodiments.

A first embodiment of the method is illustrated in FIGS. 2A to 2H.

Figure 2A:
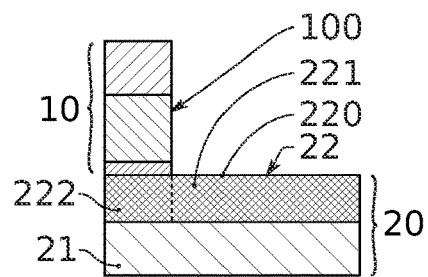
FIGS. 2A to 2H illustrate in cross-section the steps of forming a doped region according to an embodiment of the present invention.
Figure 2B:
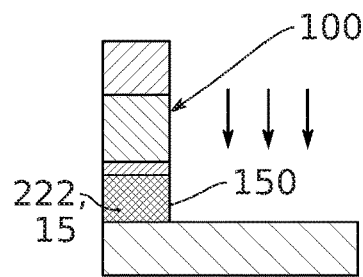

This method is preferably implemented on an initial structure comprising a gate pattern (10) and a substrate (20), as illustrated in FIG. 2A for example.

The substrate (20) may typically be a semiconductor-on-insulator type substrate, such as a silicon on insulator (SOI) substrate or a germanium on insulator GeOI substrate.

Such an SOI-type substrate 20 typically comprises:
- a bulk silicon carrier typically having a thickness of several hundreds of μm (not shown) referred to as Si bulk (meaning bulk silicon);
- a layer (21) buried in silicon dioxide, referred to as BOX (acronym of "Burried Oxide"). The layer (21) typically has a thickness of between 30 nm and 200 nm, for example in the order of 40 nm.
- An active layer (22) made of silicon, referred to as top Si (meaning top silicon). This active layer (22) preferably has a thickness of between 5 nm and 50 nm, for example in the order of 10 nm.

The active layer is overlaid by a gate stack or gate patter (10). Typically, the gate pattern (10) can successively have the following layers arranged from the active layer (22): an interface oxide layer (often referred to as gate oxide), a polycrystalline silicon gate known as polySi and a hard mask. Alternatively, this gate pattern may comprise a high dielectric constant layer, known as a "high k" layer, overlaid by a metal gate.

The gate pattern (10) typically has a height along the z-axis ranging from several dozen nanometres to several hundred nanometres. The invention also covers an alternative embodiment for which the gate pattern (10) is a sacrificial pattern designed to be removed after production of the spacers, and then to be replaced by another gate stack forming a gate (10). Such a method is commonly referred to as "last gate". In the following, the gate (10) therefore indifferently refers to a gate stack of the "gate first" type (the gate is maintained at the end of production of the spacers) or of the "gate last" type (the gate is replaced at the end of production of the spacers).

In the following description, and for the sake of conciseness, the gate pattern will simply be designated as gate (10). The active layer is designated as the topSi (22). The doped region for forming the source or drain of the transistor is designated as SID region (13).

After structuring or supplying the gate (10) and before forming the first spacer (11) on the flanks (100) of the gate (10), a first portion (221) of topSi (22), which is neither masked nor covered by the gate (10) or by spacers, is removed (FIG. 28). The gate (10) thus forms an etching mask for removing the portion (221). Removal of this first portion (221) exposes an edge (150) of a second portion (222) of the topSi covered by the gate (10), forming the channel (15) of the transistor. This edge (150) between the first (221) and second portions (222) is substantially parallel to the z-axis and lies in a continuation of the flank (100) of the gate (10). This makes it possible to subsequently align the junction between the channel and the S/D region of the transistor directly at the edge of the gate (10). This prevents a non-doped portion from remaining between the channel (15) and the S/D region subsequently formed. The access resistance of the transistor is thus decreased.

The first portion (221) preferably has a thickness $e_z$ equal to the thickness of the active layer (22). This prevents a non-doped portion from remaining outside the channel (15), under the S/D region subsequently formed. The access resistance of the transistor is thus further decreased. Since the portion (221) to be removed extends along z up to the BOX 21, it is not necessary to accurately control the depth of the recess. The BOX (21) can thus serve as a barrier layer for the removal of the topSi.

The first portion (221) is preferably removed by anisotropic dry etching and mainly directed along z. Therefore, such removal does not affect the second portion (222) masked by the gate (10) in this direction z. In a manner known to a person skilled in the art, such anisotropic dry etching can be performed by plasma, for example using etching chemistry HBr/O2 or CH2F2/SF6/N2/He, within a capacitively coupled plasma (CCP) reactor or an inductively coupled plasma (ICP) reactor. According to a possibility, the portion (221) is amorphised prior to removal by etching.

The first (11) and second (12) spacers are formed after removing the first portion (221) of the topSi (22).

Figure 2C:
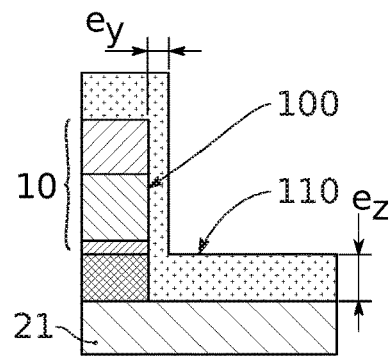

Typically, a first deposition of a first layer (110) of a first dielectric material on the gate (10) and on the active layer (22) is performed (FIG. 2C). Preferably, this first deposition is non-conformal, so as to obtain a layer (110) having a thickness $e_z$ substantially equal to the thickness of the second portion (222) of the active layer (22), at a basal part of the layer (110) in contact with the (BOX) 21, and a thickness $e_y < e_z$ at a lateral part of the layer (110) in contact with the lateral flank (100) of the gate pattern (10). The thickness $e_y$ may range between 2 nm and 10 nm. The first dielectric material may be made of silicon oxide or SiBCN, or even SiCO (silicon carbon oxygen).

Figure 2D:
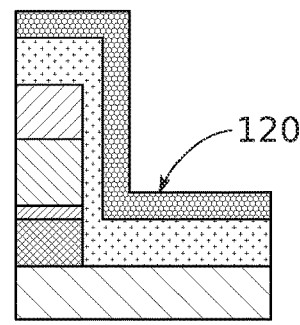

A second deposition of a second layer (120) of a second dielectric material is then performed on the first layer (110) (FIG. 2D). This second deposition may be non-conformal. The thickness of the second layer (120) may range between 5 nm and 30 nm. The second dielectric material may be made of silicon nitride SiN. The first and second dielectric materials are different from each other.

Figure 2E:
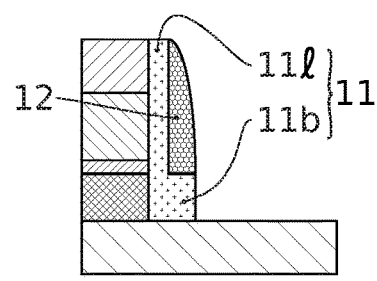

One or more anisotropic etching steps along the z-axis then allow for the removal of the horizontal portions of the two dielectric layers (110, 120) at the top of the gate (10) and on the BOX (21), while retaining portions (111, 11b, 12) of the dielectric layers on the flank (100) of the gate (10) and on the edge (150) of the second portion (222) designed to form the channel (15). These portions (111, 11b, 12) form the first (11) and second (12) spacers, also called double spacer. Thus, the first spacer (11) typically has an L shape and comprises the basal portion (11b) and the lateral portion (111). The second spacer (12) partially covers the first spacer (11) (FIG. 2E).

Figure 2F:
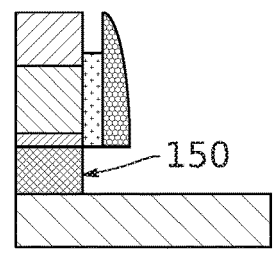

A selective etching configured to remove the basal portion (11b) of the first spacer (11) is then performed, so as to expose the edge (150) of the second portion (222) designed to form the channel (15). This selective etching preferably has a selectivity greater than 5:1 between the first dielectric material and the second dielectric material. This allows for the basal portion (11b) to be removed while maintaining the second spacer (12) (FIG. 2F). This selective etching preferably has a selectivity greater than 10:1 between the first dielectric material and the second dielectric material. This allows for the basal portion (11b) to be removed while maintaining the channel (15).

Such selective etching may be performed by wet means, using a dilute hydrofluoric acid (dHF) solution for example. Such selective etching may be performed by dry means, in particular by plasma based on at least one species comprising a fluorine or carbon atom. Plasma etching of SiO2 can be performed selectively with respect to Si, and anisotropically, using the following species or mixtures of species: CHF3/O2, C2F6, C3F8, C5F8/CO/O2/Ar. Typically, high ratios of fluorine atoms to carbon atoms provide high etching selectivity.

This selective etching exposes the edge (150) of channel (15). This edge (150) is substantially parallel to z, in a continuation of the flank (100) of the gate (10). Advantageously, this edge (150) is used to form the doped region (13) by lateral epitaxy, in a direction substantially perpendicular to the edge (150). Thus, the edge (150) becomes an interface forming a junction between the channel (15) and the doped region (13). Advantageously, this junction is directly situated at the edge of the gate (10), and plumb with the flank (100). The access resistance of the transistor may thus be decreased.

Figure 2G:
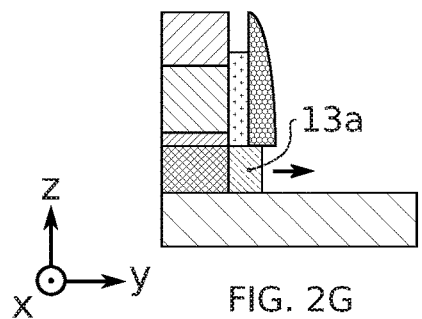
Figure 2H:
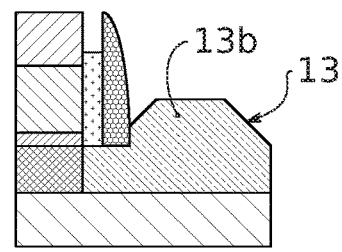

As illustrated in FIGS. 2G and 2H, lateral epitaxy is performed from the edge (150), preferably only from the edge (150), first and foremost along the y-axis (portion (13a) of the doped region (13) in FIG. 2G). Such epitaxy of the doped region (13) may be continued partially along z (portion (13b) of the doped region (13) on FIG. 2H). Such a transistor (1) configuration comprising raised S/D regions is called RSD (Raised Source/Drain).

Preferably, an in situ doped epitaxy method is used to form the doped region (13). A boron (:B) or phosphorus (:P) doping can thus be obtained. The doped region (13) may be made of SiGe:B, Si:B or Si:P, for example.

In one possibility, a cavity is formed between the BOX (21) and the doped region (13, 13b) during the lateral epitaxy. Such a cavity improves the electrical insulation between the doped region (13) and the substrate underlying the BOX (21).

The invention is not limited to the previously described embodiments and extends to all embodiments conforming with the spirit thereof.

The invention claimed is:

1. A method for forming at least one doped region intended to form a source or a drain of a transistor, comprising the following steps:
   providing a stack comprising in a direction at least one insulating layer, one active layer made of a semiconductor material overlying the insulating layer, and one transistor gate pattern overlying the active layer and having at least one lateral flank extending on a plane substantially perpendicular to an upper face of the active layer;
   removing a first portion of the active layer not overlaid by the gate pattern, the first portion extending down to the gate pattern directly at an edge of a second portion of the active layer, the second portion being located under the gate pattern, so as to expose an edge of the second portion, the edge extending in a continuation of the at least one lateral flank of the gate pattern;
   forming a first spacer made of a first material on the at least one lateral flank and on the edge, the first spacer having an L shape and comprising a basal portion in contact with the insulating layer, and a lateral portion in contact with the at least one lateral flank, the basal portion having a thickness along the direction substantially equal to a thickness of the active layer;
   forming a second spacer made of a second material on the first spacer, the second spacer having a shape complementary to that of the first spacer;
   removing the basal portion of the first spacer by selectively etching the first material with respect to the second material of the second spacer and the semiconductor material, so as to expose the edge of the second portion by at least partially retaining the lateral portion of the first spacer on the at least one lateral flank of the gate pattern; and
   forming the doped region by epitaxy from the exposed edge.

2. The method according to the claim 1 wherein the selectivity of selective etching the first material with respect to the semiconductor material is greater than or equal to 10:1.

3. The method according to claim 1 wherein the selectivity of selective etching the first material with respect to the semiconductor material is greater than or equal to 5:1.

4. The method according to claim 1 wherein forming the first spacer comprises a deposition of a non-conformal first layer, such that the first layer has a first thickness on the lateral flank and a second thickness on the insulating layer, so that the first thickness is less than the second thickness.

5. The method according to claim 1 wherein the semiconductor material of the active layer is chosen between silicon and silicon germanium, and wherein the doped region is made of silicon or silicon germanium.

6. The method according to claim 1 wherein the first material and the second material are dielectric materials.

7. The method according to claim 1 wherein the first material is made of silicon oxide or SiBCN, and wherein the second material is different from the first material and is made of silicon nitride SiN or SiCO, or of another material comprising at least two substances among Si, C, O, B, and N.

8. The method according to claim 1 wherein the epitaxy of the doped region is configured such that the doped region extends beyond the upper face of the active layer in a direction substantially perpendicular to the active layer.

9. The method according to claim 1 wherein the first portion is removed by anisotropic dry etching along the direction.

10. The method according to claim 1 wherein the epitaxy of the doped region is a lateral epitaxy obtained only from the edge of the second portion.

11. The method according to claim 1 wherein the transistor gate pattern serves as an etching mask when removing the first portion.

12. The method according to claim 1 wherein the epitaxy of the doped region is implemented with in situ doping, such that the doped region directly has doping at an end of the epitaxy.

13. The method according to claim 1 wherein the selectivity of selective etching of the first material with respect to the semiconductor material is greater than or equal to 20:1.

* * * * *